(12) United States Patent
Voigt et al.

(10) Patent No.: US 10,250,973 B1
(45) Date of Patent: *Apr. 2, 2019

(54) INTELLIGENT CONVERSATION CONTROL IN WEARABLE AUDIO SYSTEMS

(71) Applicant: Bose Corporation, Framingham, MA (US)

(72) Inventors: William Henry Arthur Voigt, Southborough, MA (US); Darren Abrams, Stow, MA (US); William D. Rice, Wayland, MA (US); Pelham Norville, Framingham, MA (US); Noah Stupak, Arlington, MA (US); John Trotter, Sudbury, MA (US)

(73) Assignee: Bose Corporation, Framingham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/918,592

(22) Filed: Mar. 12, 2018

Related U.S. Application Data

(63) Continuation-in-part of application No. 15/804,771, filed on Nov. 6, 2017, now Pat. No. 9,949,021.

(51) Int. Cl.
| | |
|---|---|
| H04R 29/00 | (2006.01) |
| H04R 1/40 | (2006.01) |
| G10L 15/26 | (2006.01) |
| H03G 3/34 | (2006.01) |
| G06F 3/01 | (2006.01) |

(52) U.S. Cl.
CPC ............ *H04R 1/406* (2013.01); *G06F 3/012* (2013.01); *G10L 15/265* (2013.01); *H03G 3/342* (2013.01)

(58) Field of Classification Search
CPC .................................................... H04R 29/00
See application file for complete search history.

(56) References Cited

U.S. PATENT DOCUMENTS

| | | | |
|---|---|---|---|
| 9,985,596 B1* | 5/2018 | Litovsky | H03G 5/165 |
| 2004/0076301 A1 | 4/2004 | Algazi et al. | |
| 2012/0239396 A1 | 9/2012 | Johnston et al. | |
| 2013/0287224 A1* | 10/2013 | Nystrom | H04R 3/005 |
| | | | 381/92 |

FOREIGN PATENT DOCUMENTS

CN 103535051 A 1/2014

OTHER PUBLICATIONS

International Search Report and Written Opinion dated Feb. 5, 2019 for International application No. PCT/US2018/059223.

* cited by examiner

*Primary Examiner* — Olisa Anwah

(57) ABSTRACT

An apparatus is configured to rest on a wearer's neck or shoulders, and has a first microphone positioned at a first position located on the right side of the wearer, when the apparatus is worn, and a second microphone positioned at a second position located on the left side of the wearer. A processor receives audio signals output by the first and second microphones, and compares the audio signals from the first microphone to the audio signals from the second microphone. Based on the comparison, the processor determines whether the wearer's head is rotated to the right, left, or center, during an instance of the user speaking. Based on the determination, the processor selects a first one of at least two audio signal destinations, and provides the audio signal from at least one of the microphones to the first selected audio signal destination.

12 Claims, 5 Drawing Sheets

US 10,250,973 B1

INTELLIGENT CONVERSATION CONTROL IN WEARABLE AUDIO SYSTEMS

PRIORITY CLAIM

This application is a continuation in part of U.S. patent application Ser. No. 15/804,771, titled Intelligent Conversation Control in Wearable Audio Systems, filed Nov. 6, 2017, now U.S. Pat. No. 9,949,021, the entire contents of which are incorporated here by reference.

BACKGROUND

This disclosure relates to intelligent control of conversations using wearable audio systems.

U.S. Pat. No. 9,571,917, incorporated here by reference, describes a device to be worn around a user's neck, as shown in FIG. 1, and which output sounds in such a way that it is more audible or intelligible to the wearer than to others in the vicinity. A commercial implementation of such a device is the SoundWear Companion wearable speaker from Bose Corporation. FIG. 2 shows a set of headphones that include an electronics module worn around the user's neck. Controls such as noise cancellation and other signal processing are performed in the neckband, and audio outputs are sent to the earbuds over wires. FIG. 3 shows a set of in-ear headphones that are connected to each other by a cord, but are otherwise wireless. In some examples of such a configuration, one earbud houses the battery, while the other houses electronics for signal processing and wireless communication, with audio signals for the first earbud sent over the cord. FIG. 4 shows a set of fully wireless headphones. In this implementation, each earbud houses a battery and the necessary electronics, though the electronics may not be identical between the two earbuds.

SUMMARY

In general, in one aspect, an apparatus includes a housing configured to rest on a wearer's neck or shoulders, a first microphone positioned at a first position on the housing located on the right side of the wearer, when the housing is worn, and a second microphone positioned at a second position on the housing located on the left side of the wearer, when the housing is worn. A processor receives audio signals output by the first and second microphones, and compares the audio signals from the first microphone to the audio signals from the second microphone. Based on the comparison, the processor determines whether the wearer's head is rotated to the right, left, or center, during an instance of the user speaking. Based on the determination, the processor selects a first one of at least two audio signal destinations, and provides the audio signal from at least one of the microphones to the first selected audio signal destination.

Implementations may include one or more of the following, in any combination. Each of the audio signal destinations may include one of a voice user interface (VUI), a virtual personal assistant (VPA), a speech to text (STT) system, a live voice call, a voice recording system, or a voice messaging system. The processor may continue to compare the audio signals from the microphones, based on the continued comparison, determine that the user's head is rotated to a different one of left, right, or center than was previously determined, and based on the new determination, select a second one of the audio signal destinations, stop providing the audio signal from the at least one of the microphones to the first selected audio signal destination, and start providing the audio signal from at least one of the microphones to the second selected audio signal destination. A speaker may be included, and the processor may, while the user is facing in the first determined direction, provide audio received from the first selected audio signal destination to the speaker, and when the user changes to the second determined direction, decrease the level of the audio provided form the first selected audio signal destination to the speaker.

First and second speakers may be associated with the left and right side of the apparatus, and the processor may, while the user is facing in the first determined direction, provide audio received from the first selected audio signal destination to both of the speakers, and when the user changes to the second determined direction, provide audio received from the second selected audio signal destination to only one of the left or right side speakers, the selected side corresponding to the second determined direction. The processor may, while the user is facing the second direction, provide audio received from the first selected audio signal destination to both of the speakers at a decreased level than was used when the user was facing the first direction. The processor may provide the microphone audio signal to the first selected destination by outputting one of the signal from the right microphone, the signal from the left microphone, or a combination of the two microphone signals according to which direction the user is determined to be facing. The first and second microphones may each include arrays of microphone elements, and the processor may, based on the determination of whether the wearer's head may be rotated to the right, left, or center, adjust filters used to combine signals from the microphone elements into array microphone signals.

Advantages include allowing a user of a wearable audio system to engage in two or more independent conversations or other audio interactions, without having to manipulate controls of the audio system.

All examples and features mentioned above can be combined in any technically possible way. Other features and advantages will be apparent from the description and the claims.

DESCRIPTION

Figure 1:
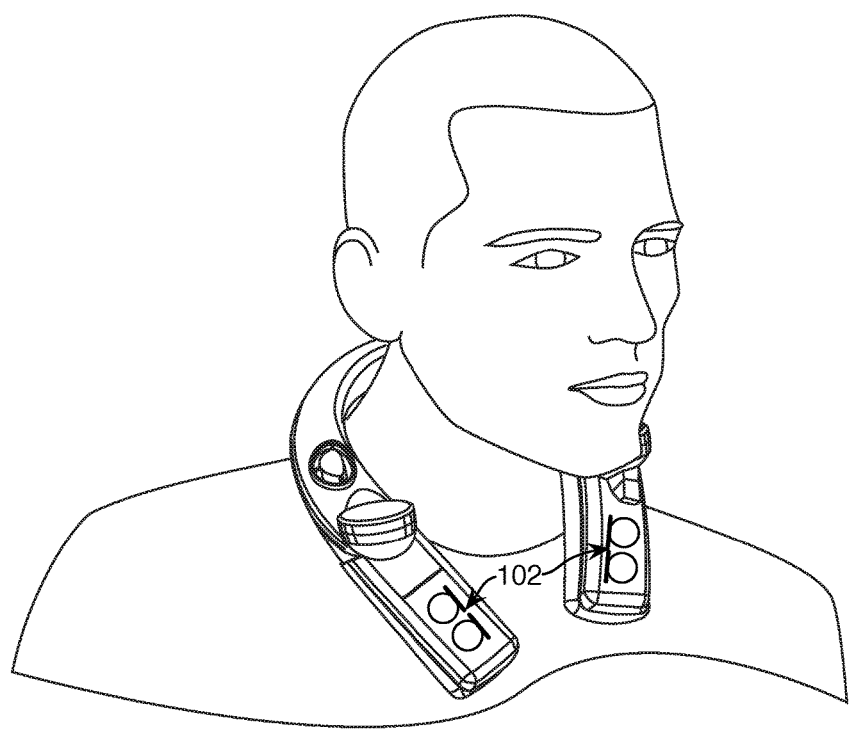
FIG. 1 shows a wearable speaker system positioned on a wearer.
Figure 2:
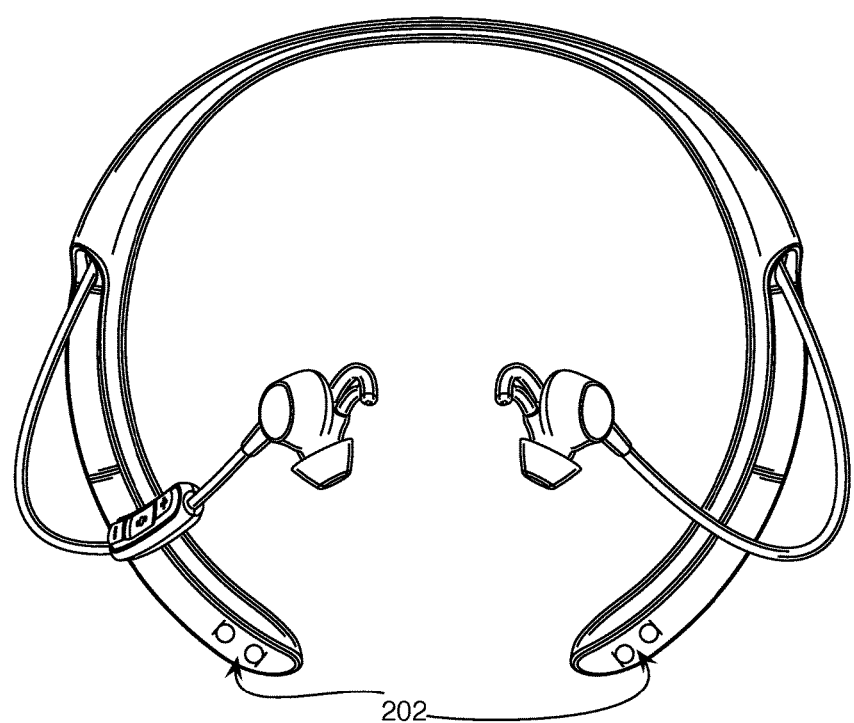
FIG. 2 shows a neckband-based set of headphones.

This disclosure describes ways in which gestures, and, in particular, where a user looks while speaking, can be used to enhance the operation of body-worn audio products. In the examples of FIG. 1 and FIG. 2, microphones 102, 202 have been added to either end of the neck-worn component. In both cases, locating the microphones on the user's body provides them with a fixed location relative to the user's head, such that when the user turns their head, the sound of their voice detected by the microphones will change, and will change differently between the two sides. Among other things, the level of the user's voice and the phase, or arrival time, will be different. Depending on the number and sensitivities of the microphones, other differences, such as spectral shape, may be detectable.

The various wearable audio device configurations described above, in which microphones are located on each side of the user's head, enable a new capability for voice user interfaces (VUI). By comparing the user's voice as received at microphones on each side, different product features may be activated based on whether the user is speaking while looking ahead or to one side or the other, or on changes to where the user is looking between utterances. For example, if the user is on a call, and speaking while looking ahead, but then turns to their side and asks a question, the VUI can mute the outbound call audio and provide the user's side question to a virtual personal assistant (VPA), which then provides the answer to the user over a local audio channel, not audible to the other people on the call. The VPA could take other actions as well, such as sending a file to the person at the other end of the call. Alternatively, a speech-to-text (STT) routine connected to the VUI can send the user's question as a text message to a preconfigured colleague, or one identified within the utterance. In another example, the user may have two calls active at the same time (e.g., a conference call with a client and a side call to a colleague), and route audio to one or the other based on whether they speak straight ahead or to the side, and send commands and questions to their voice personal assistant by speaking to the other side. In all of these cases, the user is able to direct their speech to different audiences simply by changing where they are looking, much as they could when speaking to multiple people face-to-face, all without interacting with any other user interface. At the same time, the user's VPA or other voice-based interfaces can ignore the user (or at least not interrupt them with a response) while the user is talking to other people, and know that an utterance is directed to the VPA when the user looks in the configured direction.

Various potential interactions are possible. Most generally, the user has two or three potential destinations for their utterances, and these are associated with the user looking ahead or to the left or right side. When the user transitions from one to the other, the utterance detected by the device's microphones is directed to only the destination associated with the new direction. Potential destinations include, for example, one or more simultaneous phone calls, one or more voice user interfaces, including VPAs or TTS systems, and recording, such as for personal note taking or voice messaging. For asynchronous applications, such as text messaging or voice messaging, the destination could be included in the utterance, as in "tell Sally I'll be late", or they may be pre-configured, for example, speaking to the right may automatically send a text message to the user's partner or workgroup. If a second or third voice call is not already established, speaking into a direction associated with such a call could be pre-configured to initiate the call.

Figure 5:
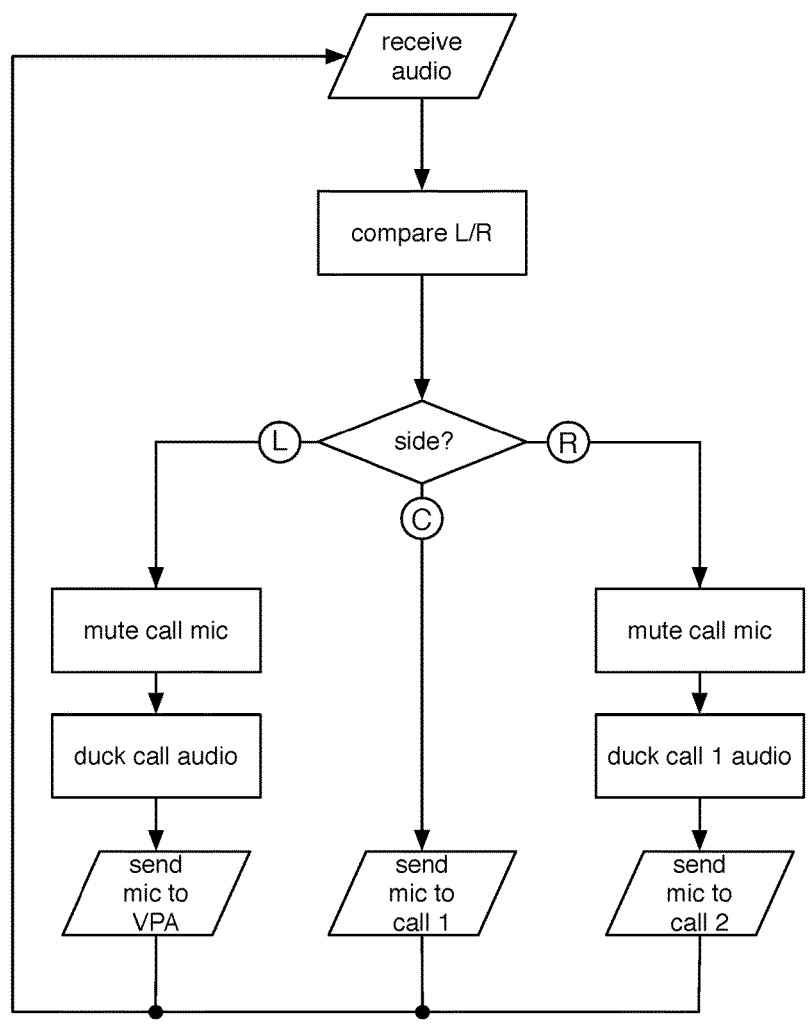
FIG. 5 shows a flow chart.

A generalized logic flow is shown in FIG. 5. In this example, incoming audio is received 602, and the left and right microphone signals are compared 604 to determine where the user is facing when speaking. Details of the comparison are explained below. Based on which direction the user is facing, the system responds 606 in one of three ways. If the user is facing to the left, the mic output to the call (associated with the center channel) is muted 608, the call audio is ducked 610, meaning it is decreased in level or muted, and the microphone output is routed 612 to the user's VPA. If the user is facing to the center, the microphone signals are routed 614 to the first call. If the user is facing to the right, the mic output to the call is muted 616, the call audio is ducked 618, and the microphone signals are routed 620 to a second call.

In addition to routing the voice and taking any actions instructed when the destination is a VPA, other pre-configured actions may be taken based on the direction the user is looking, or simply as a result of a change in direction. These include, for example, muting the microphone output to the connection associated with the direction the user is no longer facing, and ducking the audio output level of a call associated with that connection. More advanced actions include mixing the various microphone and connection audio signals. For example, the voice output signal sent to a call or to a VPA could be both microphones mixed, or only the microphone the user is speaking into. Mixing may be balanced or may be adjusted to compensate for the asymmetry in which direction the user is speaking. In some examples, the system may mix the signals only when the user is facing forward. The audio output may be routed to only one side, such as routing a VPA output to only the side used to speak to it. The audio from the various sources may be mixed, for example, when the VPA responds but the user has returned to the center conversation, the VPA audio may be mixed with the call audio.

The comparison of left and right microphone signals to determine which direction the user is facing may be done in various ways. In a simple system, the relative level of the microphone output signals may be compared, and if one side is louder than the other, this is taken to indicate that the user is facing that direction. Other comparisons may include the energy in the signal, the spectrum, or a correlation between the signals. Any of the above may be compared across the entire audible spectrum (limited, of course, to the microphones' sensitivity), or in one or more narrower bands, e.g., those associated with voice.

In some examples, the left and right microphones are both implemented as arrays, such as line arrays of microphones in the wearable speaker of FIG. 1 or neckband of FIG. 2. In addition to using array-specific techniques to determine which direction the user is speaking, the signal processing of the arrays themselves may be changed based on the speech direction, in order to better detect the voice signal once the direction has been determined.

Figure 3:
FIG. 3 shows a set of headphones connected by a cord.
Figure 4:
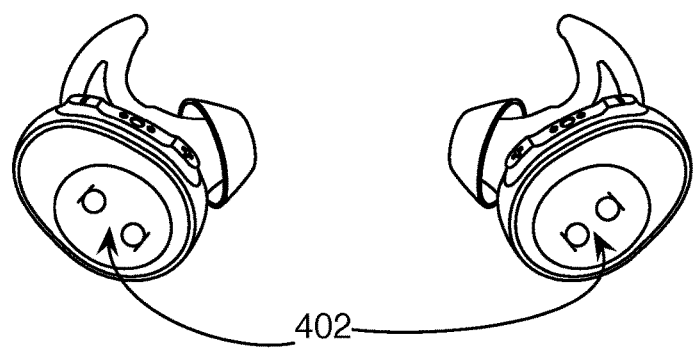
FIG. 4 shows a set of fully wireless headphones.

The same interactions can also be provided in in-ear headphones, such as those shown in FIGS. 3 and 4. Unlike neck-band headphones and body-worn speakers, in the case of headphones that are entirely in or on the ear, the microphones 302, 402 move with the user's head, so the direction the user is looking does not significantly affect the audio received by the earphone-based microphones. However, accelerometers or other motion sensors located in one or both of the ears, which may be present for other features such as biometric sensing, user interface, or on/off head detection, can be used to detect relative movement of the user's head. Based on an assumption that the user is looking ahead most of the time, rotations to one side or the other can be interpreted as the user looking to the side. More pronounced head motions, such as tilting as well as rotating to the side, could also be used to increase confidence in the detection. Once the user's look direction is detected, all the same interactions as described above may be used.

Embodiments of the systems and methods described above comprise computer components and computer-implemented steps that will be apparent to those skilled in the art. For example, it should be understood by one of skill in the art that the computer-implemented steps may be stored as computer-executable instructions on a computer-readable medium such as, for example, hard disks, optical disks, solid-state disks, flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other embodiments are within the scope of the following claims.

What is claimed is:

1. An apparatus comprising:
a set of headphones having a right headphone and a left headphone;
a microphone;
a motion sensor positioned in one of the right or left headphone; and
a processor configured to receive audio signals output by the microphone and motion data output by the motion sensor, the processor configured to:
based on the motion data, determine whether the wearer's head is rotated to the right, left, or center, during an instance of the user speaking;
based on the determination, select a first one of at least two audio signal destinations, and provide the audio signal from at least one of the microphones to the first selected audio signal destination.

2. The apparatus of claim 1, wherein:
each of the audio signal destinations comprises one of a voice user interface (VUI), a virtual personal assistant (VPA), a speech to text (STT) system, a live voice call, a voice recording system, or a voice messaging system.

3. The apparatus of claim 1, wherein the processor is further configured to:
continue to receive updated motion data from the motion sensor;
based on the updated motion data, determine that the user's head is rotated to a different one of left, right, or center than was previously determined;
based on the new determination, select a second one of the audio signal destinations, stop providing the audio signal from the microphone to the first selected audio signal destination, and start providing the audio signal from the microphone to the second selected audio signal destination.

4. The apparatus of claim 3, wherein the earphones further comprise speakers, and wherein the processor is further configured to:
while the user is facing in the first determined direction, provide audio received from the first selected audio signal destination to the speakers; and
when the user changes to the second determined direction, decrease the level of the audio provided form the first selected audio signal destination to the speakers.

5. The apparatus of claim 3, wherein the speakers comprise first and second speakers associated with the left and right earphones respectively, and wherein the processor is further configured to:
while the user is facing in the first determined direction, provide audio received from the first selected audio signal destination to both of the speakers; and
when the user changes to the second determined direction, provide audio received from the second selected audio signal destination to only one of the left or right earphone speakers, the selected earphone corresponding to the second determined direction.

6. The apparatus of claim 5, wherein the processor is further configured to:
while the user is facing the second direction, provide audio received from the first selected audio signal destination to both of the speakers at a decreased level than was used when the user was facing the first direction.

7. An apparatus comprising:
a wearable audio device;
a first microphone;
a sensor for determining a direction in which the wearer of the wearable audio device is looking; and
a processor configured to receive audio signals output by the microphone and look-direction data output by the sensor, the processor configured to:
based on the look-direction data, determine whether the wearer's head is rotated to the right, left, or center, during an instance of the user speaking;
based on the determination, provide the audio signal from the microphone to a voice personal assistant (VPA) only when the user is looking in a preconfigured one of right, left, or center.

8. The apparatus of claim 7, wherein the wearable audio device comprises:
a housing configured to rest on a wearer's neck or shoulders;
the first microphone, positioned at a first position on the housing located on the right side of the wearer, when the housing is worn; and
a second microphone positioned at a second position on the housing located on the left side of the wearer, when the housing is worn;
wherein a processor configured;
the sensor comprises the first and second microphones, and
the processor is configured to:
receive audio signals output by the first and second microphones, and
implement the sensor to determine the direction in which the wearer of the wearable audio device is looking by:
comparing the audio signals from the first microphone to the audio signals from the second microphone, and
based on the comparison, determine whether the wearer's head is rotated to the right, left, or center.

9. The apparatus of claim 7, wherein the wearable audio device comprises:
a set of headphones having a right headphone and a left headphone; and
a motion sensor positioned in one of the right or left headphone.

10. The apparatus of claim 7, wherein the processor is further configured to:

when the user is looking in a preconfigured second one of right, left, or center, convert the audio signal from the microphone to text, and transmit the text to a recipient.

11. The apparatus of claim 10, wherein the processor is configured to determine the recipient based on content of the audio signal.

12. The apparatus of claim 10, wherein the processor is configured to determine the recipient based on the direction in which the user is looking.

\* \* \* \* \*